US012785645B2

(12) United States Patent
Sawaguchi et al.

(10) Patent No.: US 12,785,645 B2
(45) Date of Patent: Nov. 3, 2026

(54) FILTER INCLUDING A PLURALITY OF RESONATORS

(71) Applicant: TDK Corporation, Tokyo (JP)

(72) Inventors: Shuhei Sawaguchi, Tokyo (JP); Tetsuzo Goto, Tokyo (JP); Yuta Ashida, Tokyo (JP); Masahiro Tatematsu, Tokyo (JP); Keigo Shibuya, Tokyo (JP); Tomonori Terui, Tokyo (JP)

(73) Assignee: TDK CORPORATION, Tokyo (JP)

( * ) Notice: Subject to any disclaimer, the term of this patent is extended or adjusted under 35 U.S.C. 154(b) by 21 days.

(21) Appl. No.: 19/091,886

(22) Filed: Mar. 27, 2025

(65) Prior Publication Data

US 2025/0309513 A1 Oct. 2, 2025

(30) Foreign Application Priority Data

Mar. 28, 2024 (JP) ................................ 2024-054320

(51) Int. Cl.

| | |
|---|---|
| ***H03H 7/01*** | (2006.01) |
| ***H01P 1/203*** | (2006.01) |
| ***H01P 1/208*** | (2006.01) |
| ***H03H 1/00*** | (2006.01) |

(52) U.S. Cl.

CPC ....... *H03H 7/0161* (2013.01); *H01P 1/20345* (2013.01); *H01P 1/2084* (2013.01); *H03H 7/0115* (2013.01); *H03H 2001/0085* (2013.01)

(58) Field of Classification Search

CPC ............... H03H 7/0161; H03H 7/0115; H03H 2001/0085; H03H 9/54; H01P 1/20345; H01P 1/2084

USPC .................................................. 333/175, 185

See application file for complete search history.

(56) References Cited

U.S. PATENT DOCUMENTS

2020/0106148 A1* 4/2020 Ashida ................ H01P 1/20381

FOREIGN PATENT DOCUMENTS

WO 2009/060696 A1 5/2009

* cited by examiner

*Primary Examiner* — Jorge L Salazar, Jr.

(74) *Attorney, Agent, or Firm* — XSENSUS LLP

(57) ABSTRACT

A filter includes a first resonator, a second resonator, and a third resonator provided between the first resonator and the second resonator in a circuit configuration, and the third resonator includes a first resonator conductor layer. A plurality of columnar conductors of a shield of the filter include two specific first columnar conductors arranged at a first interval and two specific second columnar conductors arranged at a second interval. A stack includes a first dielectric part located between the two specific first columnar conductors and a second dielectric part located between the two specific second columnar conductors. At least one of a first line part and a second line part of the first resonator conductor layer is arranged at a position closer to the second dielectric part than the first dielectric part.

12 Claims, 10 Drawing Sheets

FILTER INCLUDING A PLURALITY OF RESONATORS

CROSS-REFERENCE TO RELATED APPLICATION

This application claims the benefit of Japanese Priority Patent Application No. 2024-054320, filed on 28 Mar. 2024, the entire contents of which are incorporated herein by reference.

BACKGROUND

The disclosure relates to a filter including a stack and a plurality of resonators.

One of electronic components used in a communication apparatus is a band-pass filter including a plurality of resonators. For example, each of the plurality of resonators is formed of a conductor layer having a predetermined length. In particular, size reduction of a band-pass filter used in a small-size communication apparatus is required. As a band-pass filter suitable for miniaturization, a band-pass filter using a stack including a plurality of dielectric layers stacked together and a plurality of conductor layers is known.

In order to prevent radiation of an electro-magnetic wave to the surrounding area, some band-pass filters have a structure in which a plurality of resonators are surrounded by a shield. For example, WO 2009/060696 discloses a chip-type filter member in which a ground electrode being a tubular body is provided to a chip main body and a resonator electrode provided in the chip main body is surrounded by the tubular body. Two ground electrodes that are electrically connected to each other by a via hole electrode passing through the chip main body are provided to the upper part and the lower part of the resonator electrode.

A stack forming a band-pass filter is formed in the following manner, for example. First, a plurality of ceramic green sheets that eventually become a plurality of dielectric layers are prepared. Each of the ceramic green sheets includes a plurality of unfired conductor layers formed thereon and a plurality of unfired through holes formed therein. The plurality of unfired conductor layers eventually become a plurality of conductor layers. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete a stack.

In the process of manufacturing a band-pass filter, when a plurality of ceramic green sheets are stacked together, the plurality of ceramic green sheets may be deviated slightly from each other. In such a case, an interval between a conductor layer formed in a certain dielectric layer and a through hole formed in another dielectric layer is deviated from a design value. In a case in which the conductor layer is a conductor layer for a resonator, when the interval between the conductor layer and the through hole is deviated, a problem that desired filter characteristics cannot be obtained arises.

SUMMARY

A filter according to one embodiment of the disclosure includes a stack including a plurality of dielectric layers being stacked together, a first input/output terminal and a second input/output terminal that are integrated with the stack, a plurality of resonators being provided in the stack and being provided between the first input/output terminal and the second input/output terminal in a circuit configuration, and a shield being formed of a conductor and being integrated with the stack. The plurality of resonators includes a first resonator, a second resonator, and a third resonator provided between the first resonator and the second resonator in the circuit configuration. The first resonator is connected to the first input/output terminal. The second resonator is connected to the second input/output terminal.

The third resonator includes a first resonator conductor layer extending along an orthogonal plane orthogonal to a stacking direction of the plurality of dielectric layers. The first resonator conductor layer includes a first end portion and a second end portion that are located at both ends in a longitudinal direction of the first resonator conductor layer, and includes a first line part including the first end portion, a second line part including the second end portion, and a first center part connecting the first line part and the second line part to each other. The shield includes a first conductor layer and a second conductor layer that are arranged at an interval in the stacking direction to sandwich the plurality of resonators, and a plurality of columnar conductors that respectively extend in the stacking direction and connect the first conductor layer and the second conductor layer to each other. The plurality of columnar conductors are arrayed along an outer surface of the stack to surround the plurality of resonators. The plurality of columnar conductors include two specific first columnar conductors that are arranged at a first interval and two specific second columnar conductors that are arranged at a second interval larger than the first interval.

The stack further includes a first dielectric part located between the first conductor layer and the second conductor layer and between the two specific first columnar conductors, and a second dielectric part located between the first conductor layer and the second conductor layer and between the two specific second columnar conductors. At least one of the first line part and the second line part is arranged at a position closer to the second dielectric part than the first dielectric part.

Other and further objects, features, and advantages of the disclosure will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
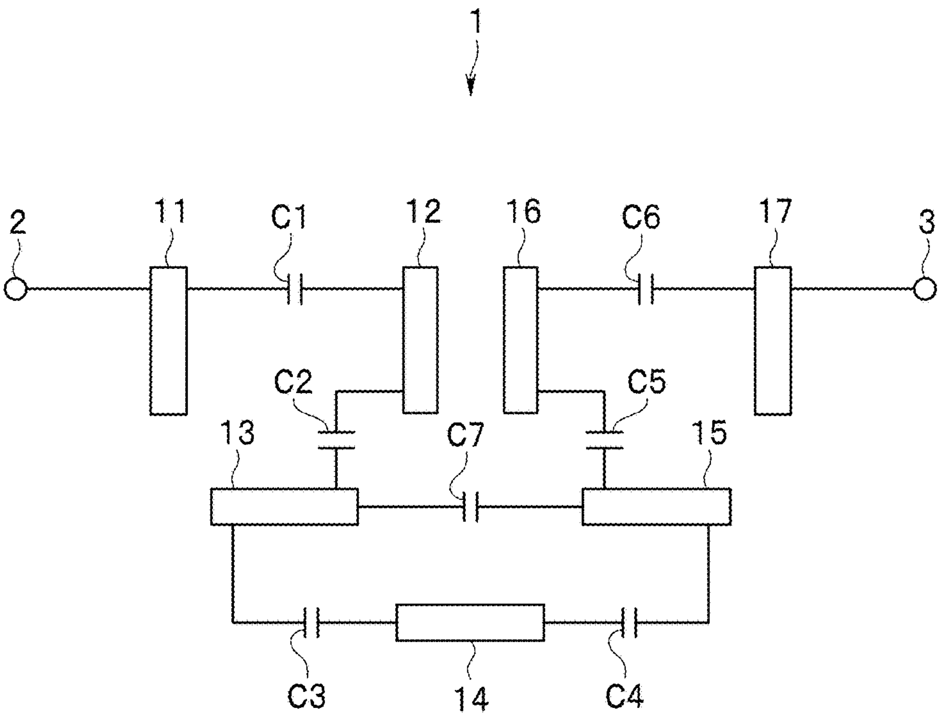
FIG. 1 is a circuit diagram showing an example of a circuit configuration of a filter according to the exemplary embodiment of the disclosure.

An object of the disclosure is to provide a filter that can suppress changes in characteristics due to misalignment in a stack during manufacturing.

In the following, some example embodiments and modification examples of the disclosure will be described in detail with reference to the accompanying drawings. Note that the following description is directed to illustrative examples of the disclosure and not to be construed as limiting the disclosure. Factors including, without limitation, numerical values, shapes, materials, components, positions of the components, and how the components are coupled to each other are illustrative only and not to be construed as limiting the disclosure. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. The description is made in the following order.

First, with reference to FIG. 1, an overall configuration of a filter 1 according to the exemplary embodiment of the disclosure is described. FIG. 1 is a circuit diagram showing a circuit configuration of the filter 1 according to the exemplary embodiment. The filter 1 includes a first input/output terminal 2, and a second input/output terminal 3, and a plurality of resonators. Each of the first and second input/output terminals 2 and 3 is a terminal for inputting or outputting a signal. In other words, when a signal is input to the first input/output terminal 2, a signal is output from the second input/output terminal 3. When a signal is input to the second input/output terminal 3, a signal is output from the first input/output terminal 2.

The plurality of resonators are provided between the first input/output terminal 2 and the second input/output terminal 3 in a circuit configuration. The plurality of resonators are configured so that two adjacent resonators in the circuit configuration are electro-magnetically coupled to each other. Note that, in the present application, the expression "in the (a) circuit configuration" is used to describe layout in a circuit diagram, not in a physical configuration.

Each of the resonators is a distributed constant resonator formed of a distributed constant line. An example of the circuit configuration of the filter 1 including the plurality of distributed constant resonators is described.

The plurality of resonators include seven resonators 11, 12, 13, 14, 15, 16, and 17. The seven resonators 11, 12, 13, 14, 15, 16, and 17 are arranged in the stated order from the first input/output terminal 2 side in the circuit configuration. In the exemplary embodiment, in particular, each of the resonators 11 to 17 is an open-ended resonator, and is a ½ wavelength resonator. One of the resonators 11 and 17 corresponds to a "first resonator" in the disclosure, and the other of the resonators 11 and 17 corresponds to a "second resonator" in the disclosure.

The resonators 11 to 17 are configured so that the resonators 11 and 12 are adjacent to each other in the circuit configuration and are electro-magnetically coupled to each other, the resonators 12 and 13 are adjacent to each other in the circuit configuration and are electro-magnetically coupled to each other, the resonators 13 and 14 are adjacent to each other in the circuit configuration and are electro-magnetically coupled to each other, the resonators 14 and 15 are adjacent to each other in the circuit configuration and are electro-magnetically coupled to each other, the resonators 15 and 16 are adjacent to each other in the circuit configuration and are electro-magnetically coupled to each other, and the resonators 16 and 17 are adjacent to each other in the circuit configuration and are electro-magnetically coupled to each other. In the exemplary embodiment, in particular, electro-magnetic coupling between the two adjacent resonators in the circuit configuration is capacitive.

The resonators 11 to 17 are configured so that two resonators that are not adjacent to each other in the circuit configuration are electro-magnetically coupled. In the exemplary embodiment, the resonators 13 and 15 are configured so as to be electro-magnetically coupled to each other. In the exemplary embodiment, in particular, electro-magnetic coupling between the resonators 13 and 15 is capacitive.

The resonator 14 is provided at a position farther from both the first input/output terminal 2 and the second input/output terminal 3 than the resonators 11 to 13 and 15 to 17 in the circuit configuration.

The filter 1 further includes a capacitor C1 that achieves capacitive coupling between the resonators 11 and 12, a capacitor C2 that achieves capacitive coupling between the resonators 12 and 13, a capacitor C3 that achieves capacitive coupling between the resonators 13 and 14, a capacitor C4 that achieves capacitive coupling between the resonators 14 and 15, a capacitor C5 that achieves capacitive coupling between the resonators 15 and 16, a capacitor C6 that achieves capacitive coupling between the resonators 16 and 17, and a capacitor C7 that achieves capacitive coupling between the resonators 13 and 15.

The resonators 11 to 17 and the capacitors C1 to C7 are configured so that the filter 1 functions as a band-pass filter that selectively causes a signal in a predetermined frequency band to pass.

Figure 2:
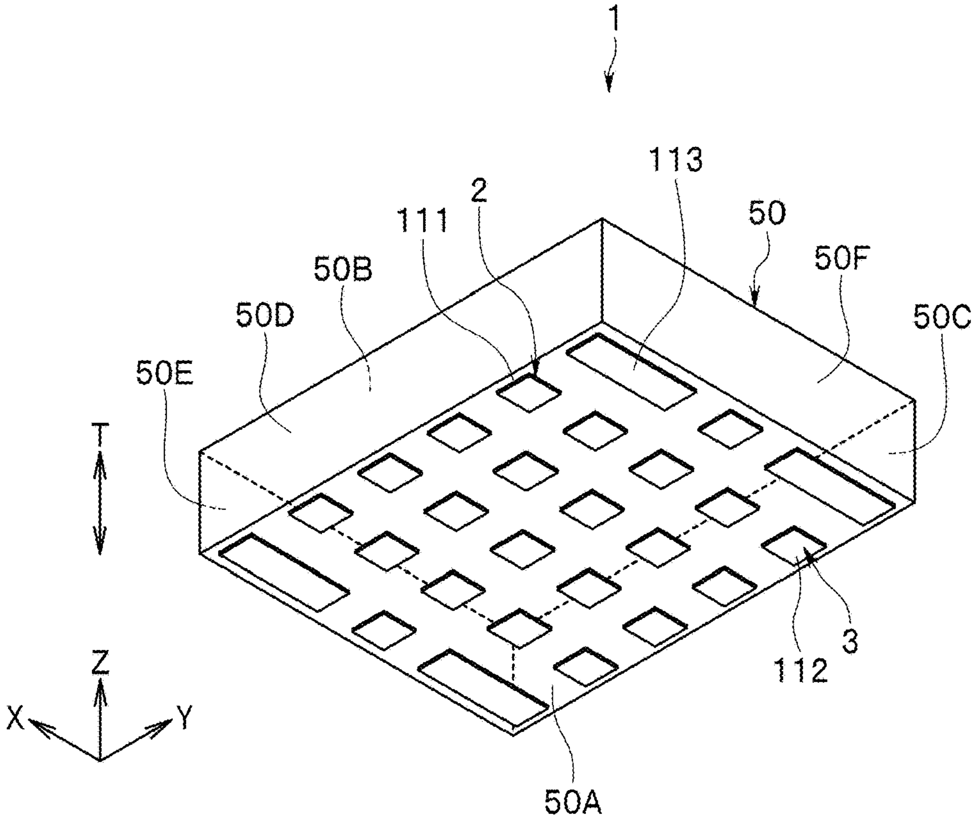
FIG. 2 is a perspective view showing an external appearance of the filter according to the exemplary embodiment of the disclosure.

Next, other configurations of the filter 1 are described with reference to FIG. 2. FIG. 2 is a perspective view showing an outside view of the filter 1.

The filter 1 further includes a stack 50 that is formed of a dielectric and integrates the first input/output terminal 2, the second input/output terminal 3, the resonators 11 to 17, and the capacitors C1 to C7 with each other. The stack 50 includes a plurality of dielectric layers being stacked together and a plurality of conductors (a plurality of electrodes, a plurality of conductor layers, and a plurality of through holes). The resonators 11 to 17 and the capacitors C1 to C7 are formed by the plurality of conductors provided in the stack 50. Each of the plurality of dielectric layers is formed of a dielectric material. For example, low-temperature co-fired ceramics (LTCC) are used as the dielectric material.

The stack 50 includes a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other, and the side surfaces 50E and 50F are also opposite to each other. The side surfaces 50C to 50F perpendicular to the bottom surface 50A and the top surface 50B.

Here, an X direction, a Y direction, and a Z direction are defined as shown in FIG. 2. The X direction, the Y direction, and the Z direction are orthogonal to one another. In the exemplary embodiment, a direction parallel to the stacking direction T is defined to as the Z direction. A direction opposite to the X direction is defined as a −X direction, a direction opposite to the Y direction is defined as a −Y direction, and a direction opposite to the Z direction is defined as a −Z direction. The expression "as viewed in the (a) predetermined direction (for example, the stacking direction T)" indicates that a target object is seen from a position away from the target object in the predetermined direction or a direction parallel to the predetermined direction.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter 1 further includes electrodes 111 and 112 provided to the bottom surface 50A of the stack 50. The electrode 111 is arranged in the vicinity of the side surface 50D. The electrode 112 is arranged in the vicinity of the side surface 50C. The electrode 111 corresponds to the first input/output terminal 2, and the electrode 112 corresponds to the second input/output terminal 3. Thus, the first and second input/output terminals 2 and 3 are provided to the bottom surface 50A of the stack 50.

The filter 1 further includes a plurality of ground electrodes 113 provided to the bottom surface 50A of the stack 50. In the exemplary embodiment, in particular, the plurality of ground electrodes 113 include a plurality of electrodes arranged between the electrodes 111 and 112 and the side surface 50E, a plurality of electrodes arranged between the electrodes 111 and 112 and the side surface 50F, and a plurality of electrodes arranged between the electrode 111 and the electrode 112. Each of the plurality of ground electrodes 113 is connected to the ground.

Next, an example of the plurality of dielectric layers and the plurality of conductor layers forming the stack 50 is described with reference to FIG. 3 to FIG. 11. In this example, the stack 50 includes nineteen dielectric layers stacked together. In the following, the nineteen dielectric layers are referred to as the first to nineteenth dielectric layers in the order from bottom to top. The first to nineteenth dielectric layers are denoted by reference symbols 51 to 69, respectively.

In FIG. 3 to FIG. 10, the plurality of circles respectively represent the plurality of through holes. In each of the dielectric layers 51 to 68, the plurality of through holes are formed. The plurality of through holes are each formed by filling a hole intended for a through hole with a conductive paste. Each of the plurality of through holes is connected to an electrode, a conductor layer, or another through hole. In the following description, with regard to a connection relationship between each of a plurality of through holes and an electrode, a conductor layer, or another through hole is described, a connection relationship in a state where the first to nineteenth dielectric layers 51 to 69 are stacked is described. In FIG. 3 to FIG. 10, a plurality of specific through holes among the plurality of through holes are denoted with respective reference symbols.

Figure 3:
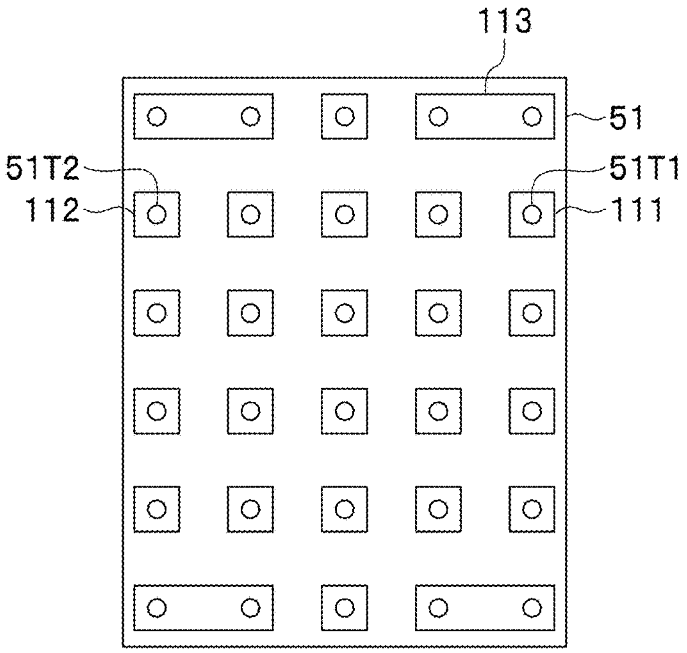
FIG. 3 is an explanatory diagram showing a patterned surface of a first dielectric layer of a stack of the filter according to the exemplary embodiment of the disclosure.

FIG. 3 shows the patterned surface of the first dielectric layer 51. The electrodes 111 and 112 and the plurality of ground electrodes 113 are formed on the patterned surface of the dielectric layer 51.

A through hole denoted with the reference symbol 51T1 in FIG. 3 is connected to the electrode 111. Note that, in the following description, the through hole denoted with the reference symbol 51T1 is simply referred to as the through hole 51T1. Through holes denoted with reference symbols other than the through hole 51T1 are referred similarly to the through hole 51T1. The through hole 51T2 shown in FIG. 3 is connected to the electrode 112.

Figure 4:
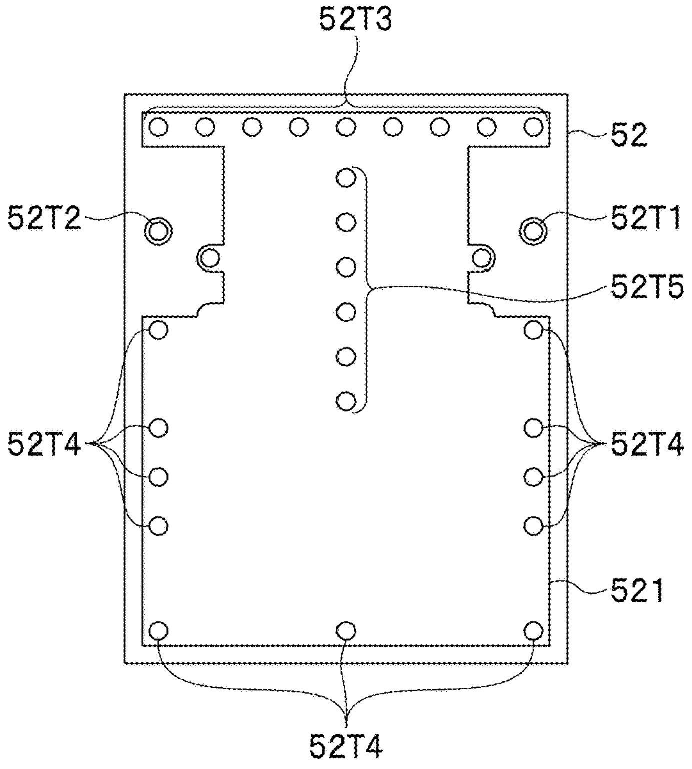
FIG. 4 is an explanatory diagram showing a patterned surface of a second dielectric layer of the stack of the filter according to the exemplary embodiment of the disclosure.

FIG. 4 shows the patterned surface of the second dielectric layer 52. A conductor layer 521 is formed on the patterned surface of the dielectric layer 52. The through holes 51T1 and 51T2 are connected to the through holes 52T1 and 52T2 shown in FIG. 4, respectively. The plurality of through holes 52T3, the plurality of through holes 52T4, and the plurality of through holes 52T5 shown in FIG. 4 are connected to the conductor layer 521.

Figure 5:
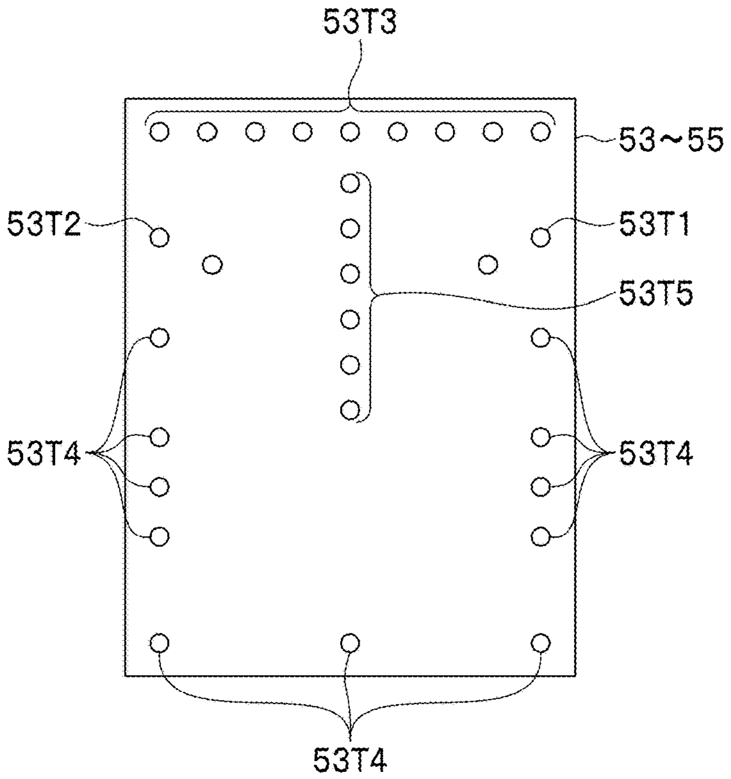
FIG. 5 is an explanatory diagram showing patterned surfaces of third to fifth dielectric layers of the stack of the filter according to the exemplary embodiment of the disclosure.

FIG. 5 shows the respective patterned surfaces of the third to fifth dielectric layers 53 to 55. The through holes 52T1 and 52T2 are connected to the through holes 53T1 and 53T2 formed in the dielectric layer 53, respectively. The plurality of through holes 52T3, the plurality of through holes 52T4, and the plurality of through holes 52T5 are connected to the plurality of through holes 53T3, the plurality of through holes 53T4, and the plurality of through holes 53T5 formed in the dielectric layer 53, respectively. In the dielectric layers 53 to 55, every vertically adjacent through holes denoted with the same reference symbol are connected to each other.

Figure 6:
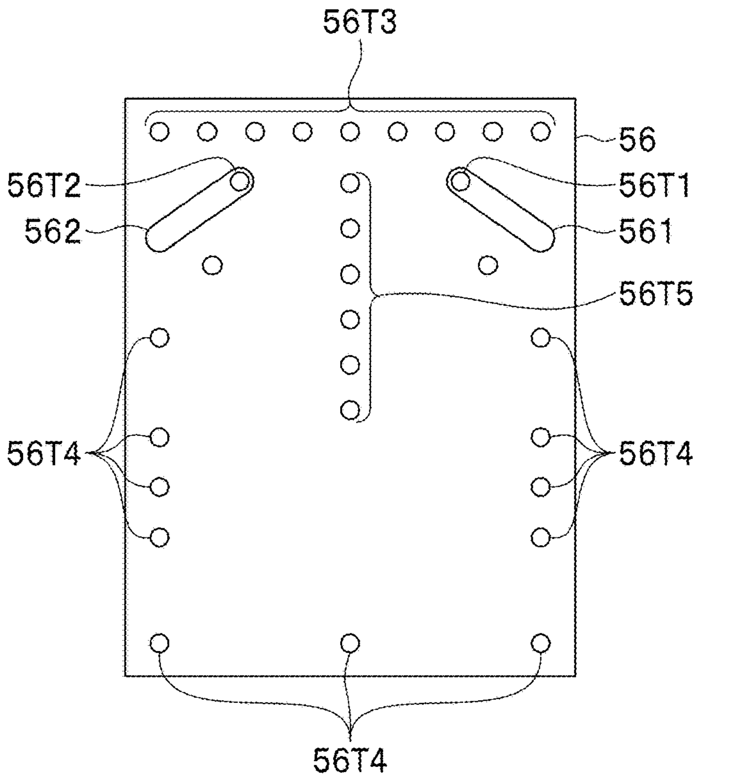
FIG. 6 is an explanatory diagram showing a patterned surface of a sixth dielectric layer of the stack of the filter according to the exemplary embodiment of the disclosure.

FIG. 6 shows the patterned surface of the sixth dielectric layer 56. Conductor layers 561 and 562 are formed on the patterned surface of the dielectric layer 56. The through hole 53T1 formed in the dielectric layer 55 and the through hole 56T1 shown in FIG. 6 are connected to the conductor layer 561. The through hole 53T2 formed in the dielectric layer 55 and the through hole 56T2 shown in FIG. 6 are connected to the conductor layer 562. The plurality of through holes 53T3, the plurality of through holes 53T4, and the plurality of through holes 53T5 formed in the dielectric layer 55 are connected to the plurality of through holes 56T3, the plurality of through holes 56T4, and the plurality of through holes 56T5 shown in FIG. 6, respectively.

Figure 7:
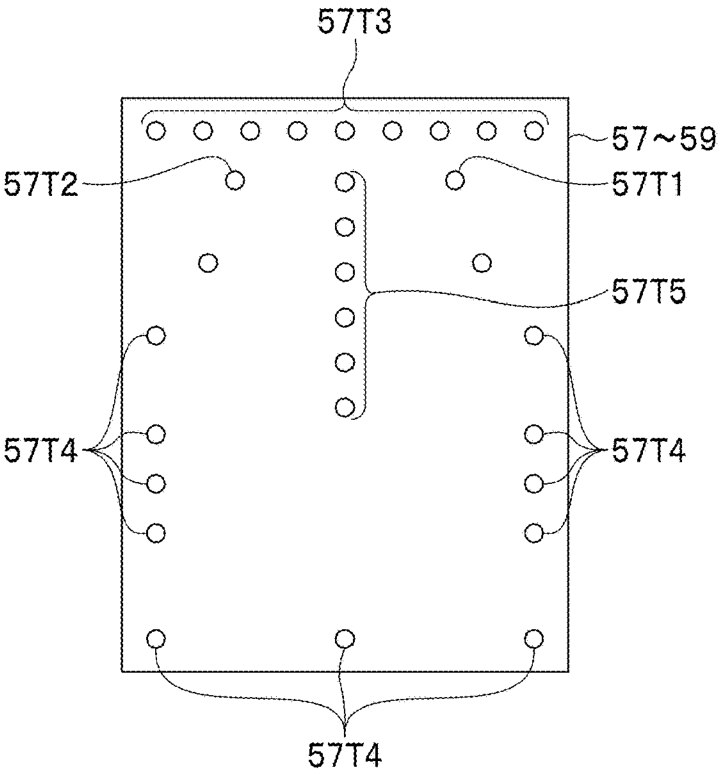
FIG. 7 is an explanatory diagram showing patterned surfaces of seventh to ninth dielectric layers of the stack of the filter according to the exemplary embodiment of the disclosure.

FIG. 7 shows the respective patterned surfaces of the seventh to ninth dielectric layers 57 to 59. The through holes 56T1 and 56T2 are connected to the through holes 57T1 and 57T2 formed in the dielectric layer 57, respectively. The plurality of through holes 56T3, the plurality of through holes 56T4, and the plurality of through holes 56T5 are connected to the plurality of through holes 57T3, the plurality of through holes 57T4, and the plurality of through holes 57T5 formed in the dielectric layer 57, respectively. In the dielectric layers 57 to 59, every vertically adjacent through holes denoted with the same reference symbol are connected to each other.

Figure 8:
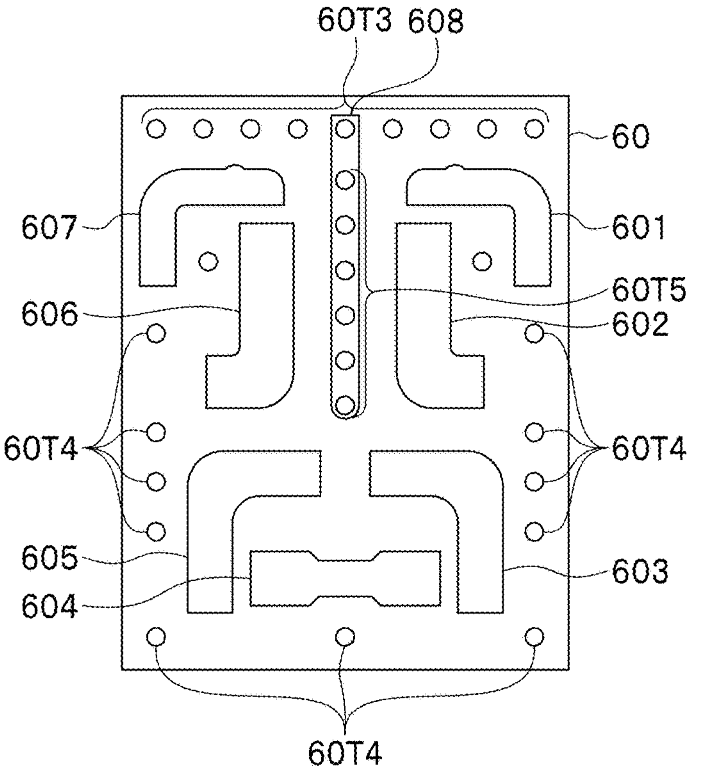
FIG. 8 is an explanatory diagram showing a patterned surface of a tenth dielectric layer of the stack of the filter according to the exemplary embodiment of the disclosure.

FIG. 8 shows the patterned surface of the tenth dielectric layer 60. Resonator conductor layers 601, 602, 603, 604, 605, 606, and 607 and the conductor layer 608 are formed on the patterned surface of the dielectric layer 60. The through holes 57T1 and 57T2 formed in the dielectric layer 59 are connected to the conductor layers 601 and 607, respectively. The plurality of through holes 57T3 and the plurality of through holes 57T4 formed in the dielectric layer 59 are connected to the plurality of through holes 60T3 and the plurality of through holes 60T4 shown in FIG. 8, respectively. The plurality of through holes 57T5 formed in the dielectric layer 59 and the plurality of through holes 60T5 formed in FIG. 8 are connected to the conductor layer 608.

Figure 9:
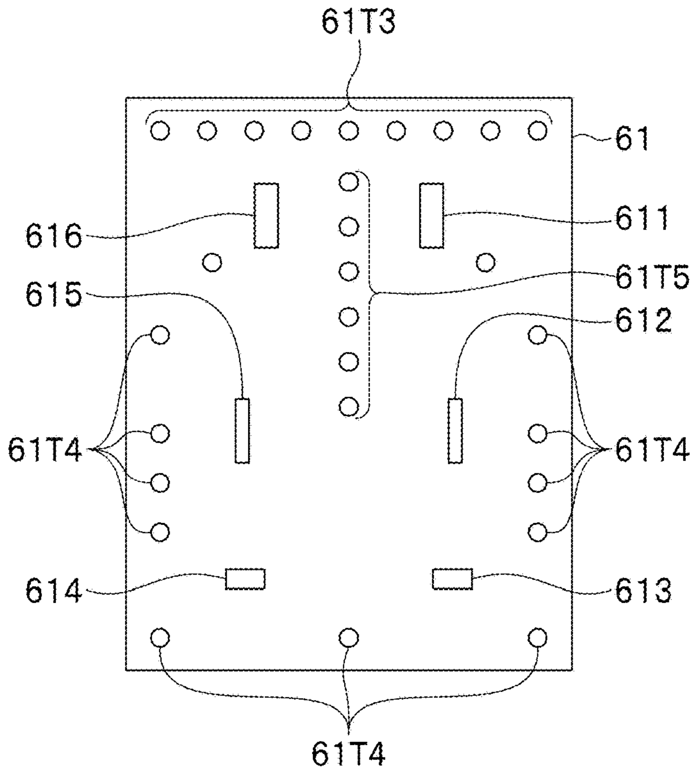
FIG. 9 is an explanatory diagram showing a patterned surface of an eleventh dielectric layer of the stack of the filter according to the exemplary embodiment of the disclosure.

FIG. 9 shows the patterned surface of the eleventh dielectric layer 61. Conductor layers 611, 612, 613, 614, 615, and 616 are formed on the patterned surface of the dielectric layer 61. The plurality of through holes 60T3, the plurality of through holes 60T4, and the plurality of through holes 60T5 are connected to the plurality of through holes 61T3, the plurality of through holes 61T4, and the plurality of through holes 61T5 shown in FIG. 9, respectively.

Figure 10:
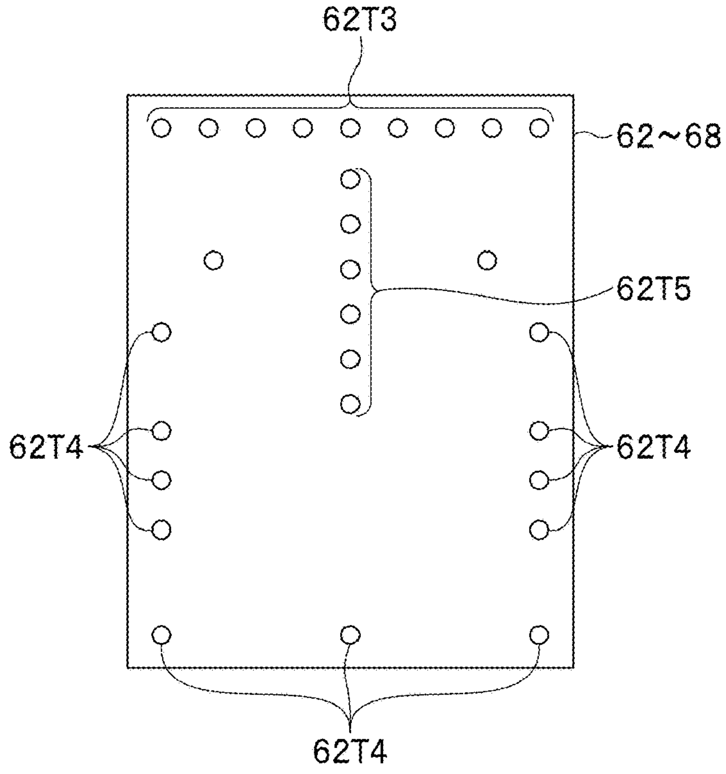
FIG. 10 is an explanatory diagram showing patterned surfaces of twelfth to eighteenth dielectric layers of the stack of the filter according to the exemplary embodiment of the disclosure.

FIG. 10 shows the respective patterned surfaces of the twelfth to eighteenth dielectric layers 62 to 68. The plurality of through holes 61T3, the plurality of through holes 61T4, and the plurality of through holes 61T5 are connected to the plurality of through holes 62T3, the plurality of through holes 62T4, and the plurality of through holes 62T5 formed in the dielectric layer 62, respectively. In the dielectric layers 62 to 68, every vertically adjacent through holes denoted with the same reference symbol are connected to each other.

Figure 11:
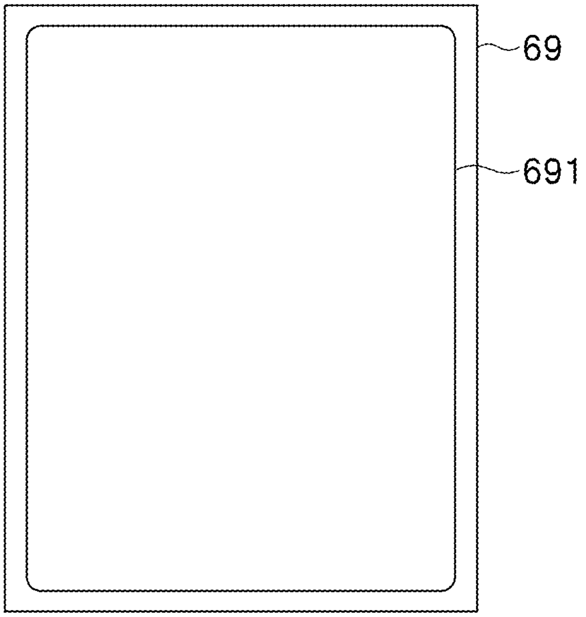
FIG. 11 is an explanatory diagram showing a patterned surface of a nineteenth dielectric layer of the stack of the filter according to the exemplary embodiment of the disclosure.

FIG. 11 shows the patterned surface of the nineteenth dielectric layer 69. A conductor layer 691 is formed on the patterned surface of the dielectric layer 69. The plurality of through holes 62T3, the plurality of through holes 62T4, and the plurality of through holes 62T5 shown in the dielectric layer 68 are connected to the conductor layer 691.

The stack 50 shown in FIG. 2 is formed by stacking the first to nineteenth dielectric layers 51 to 69 such that the patterned surface of the first dielectric layer 51 serves as the bottom surface 50A of the stack 50 and the surface of the nineteenth dielectric layer 69 opposite to the patterned surface thereof serves as the top surface 50B of the stack 50.

Figure 12:
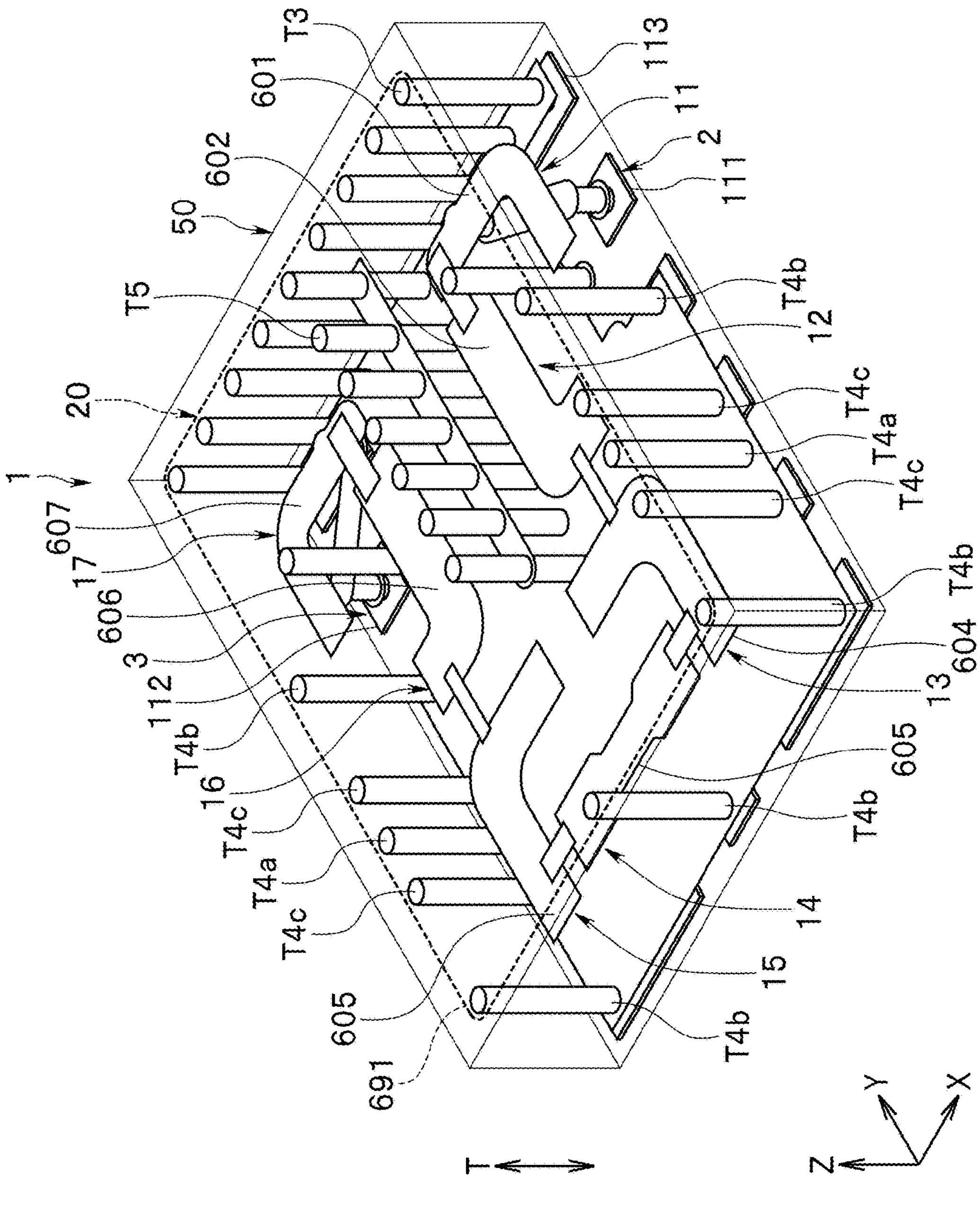
FIG. 12 is a perspective view showing an internal structure of the stack of the filter according to the exemplary embodiment of the disclosure.

FIG. 12 shows the internal structure of the stack 50 formed by stacking the first to nineteenth dielectric layers 51 to 69. As shown in FIG. 12, the plurality of conductor layers and the plurality of through holes shown in FIG. 3 to FIG. 11 are stacked together inside the stack 50.

Correspondences between the components of the filter 1 shown in FIG. 1 and the internal components of the stack 50 shown in FIG. 2 to FIG. 11 are described below. The resonator 11 is formed of the resonator conductor layer 601. The resonator 12 is formed of the resonator conductor layer 602. The resonator 13 is formed of the resonator conductor layer 603. The resonator 14 is formed of the resonator conductor layer 604. The resonator 15 is formed of the resonator conductor layer 605. The resonator 16 is formed of the resonator conductor layer 606. The resonator 17 is formed of the resonator conductor layer 607.

The capacitor C1 is formed of the conductor layers 601, 602, and 611 and the dielectric layer 60 interposed between those conductor layers. The capacitor C2 is formed of the conductor layers 602, 603, and 612 and the dielectric layer 60 interposed between those conductor layers. The capacitor C3 is formed of the conductor layers 603, 604, and 613 and the dielectric layer 60 interposed between those conductor layers. The capacitor C4 is formed of the conductor layers 604, 605, and 614 and the dielectric layer 60 interposed between those conductor layers. The capacitor C5 is formed of the conductor layers 605, 606, and 615 and the dielectric layer 60 interposed between those conductor layers. The capacitor C6 is formed of the conductor layers 606, 607, and 616 and the dielectric layer 60 interposed between those conductor layers. The capacitor C7 is formed of the conductor layers 603 and 605.

Figure 13:
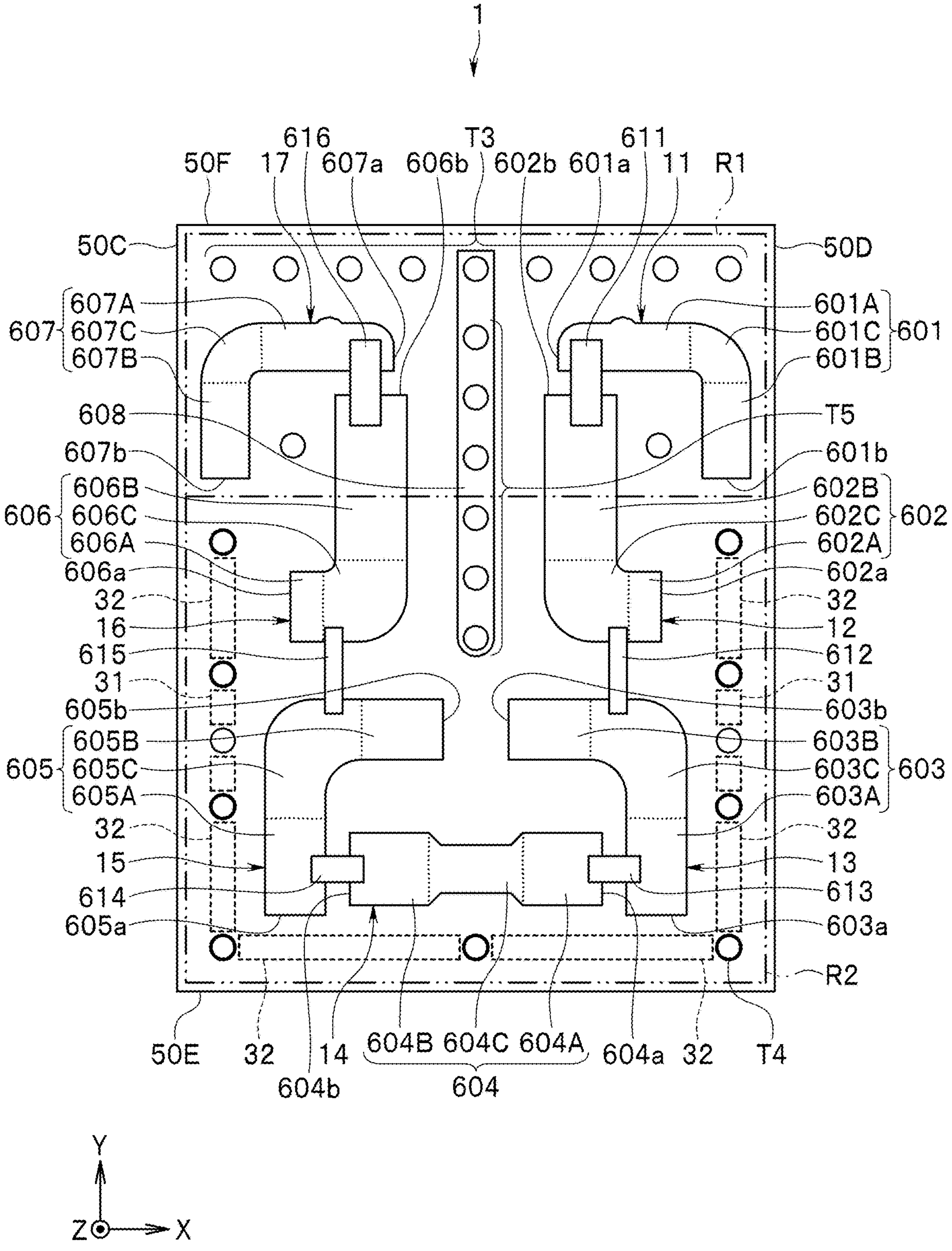
FIG. 13 is a plan view showing a part of the internal structure of the stack of the filter according to the exemplary embodiment of the disclosure.

Next, structural features of the filter 1 according to the exemplary embodiment are described. First, with reference to FIG. 3 to FIG. 13, the shape and the arrangement of the resonators 11 to 17 are described. FIG. 13 is a plan view showing a part of the inside of the stack 50. As described above, the resonators 11, 12, 13, 14, 15, 16, and 17 are formed of the resonator conductor layers 601, 602, 603, 604, 605, 606, and 607, respectively. Each of the conductor layers 601 to 607 extends along an orthogonal plane orthogonal to the stacking direction T. The conductor layers 601 to 607 are arranged at the same position in the stacking direction T.

Each of the conductor layers 601 to 603 and 605 to 607 has an L-like shape as viewed in the stacking direction T. The conductor layer 601 and the conductor layer 607 have a symmetrical or substantially symmetrical shape with respect to the YZ plane. The conductor layer 602 and the conductor layer 606 have a symmetrical or substantially symmetrical shape with respect to the YZ plane. The conductor layer 603 and the conductor layer 605 have a symmetrical or substantially symmetrical shape with respect to the YZ plane.

The conductor layer 604 has an I-like shape as viewed in the stacking direction T. Note that, in the exemplary embodiment, the number of the plurality of resonators of the filter 1 is an odd number. The plurality of resonators do not include the conductor layer 604, in other words, the other resonator symmetric to the resonator 14.

The conductor layer 601 is arranged in the vicinity of a corner portion at a position where the side surface 50D and the side surface 50F intersect with each another. The conductor layer 603 is arranged in the vicinity of a corner portion at a position where the side surface 50D and the side surface 50E intersect with each another. The conductor layer 602 is arranged between the conductor layer 601 and the conductor layer 603.

The conductor layer 605 is disposed near a corner at a position where the side surface 50C and the side surface 50E intersect with each another. The conductor layer 607 is arranged in the vicinity of a corner portion at a position where the side surface 50C and the side surface 50F intersect with each another. The conductor layer 606 is arranged between the conductor layer 605 and the conductor layer 607.

The conductor layer 604 is arranged between the conductor layer 603 and the conductor layer 605 in the vicinity of the side surface 50E. The conductor layer 604, in other words, the resonator 14 is provided at a position farther away from both the first and second input/output terminals 2 and 3, in other words, the electrodes 111 and 112 than the resonators 11 to 13 and 15 to 17 in a physical sense.

The conductor layer 601 includes a first end portion 601*a* and a second end portion 601*b* that are located at both ends in a longitudinal direction of the conductor layer 601. The conductor layer 601 includes a first line part 601A including the first end portion 601*a*, a second line part 601B including the second end portion 601*b*, and a center part 601C connecting the first line part 601A and the second line part 601B to each other. In FIG. 13, the boundary between the first line part 601A and the center part 601C and the boundary between the second line part 601B and the center part 601C are indicated with the respective dot lines. Note that the boundaries of the two parts in the conductor layers other than the conductor layer 601 are indicated similarly to those in the conductor layer 601.

The first line part 601A has a shape elongated in a direction parallel to the X direction. The second line part 601B has a shape elongated in a direction parallel to the Y direction. The first line part 601A is arranged between the conductor layer 602 and the side surface 50F. The second line part 601B is arranged between the first line part 601A and the side surface 50D.

The first line part 601A is connected to the electrode 111 corresponding to the first input/output terminal 2 via the through holes 51T1, 52T1, and 53T1, the conductor layer 561, and the through holes 56T1 and 57T1.

The conductor layer 602 includes a first end portion 602*a* and a second end portion 602*b* that are located at both ends in a longitudinal direction of the conductor layer 602. The conductor layer 602 includes a first line part 602A including the first end portion 602*a*, a second line part 602B including the second end portion 602*b*, and a center part 602C connecting the first line part 602A and the second line part 602B to each other. The second line part 602B has a shape elongated in a direction parallel to the Y direction.

The conductor layer 611 forming the capacitor C1 overlaps with the first line part 601A of the conductor layer 601 and the second line part 602B of the conductor layer 602 as viewed in the stacking direction T. The first line part 602A is arranged between the second line part 602B and the side surface 50D. The second end portion 602*b* is arranged at a position farther from the outer surface (the side surface 50D) of the stack 50 than the first end portion 602*a*.

The conductor layer 607 includes a first end portion 607*a* and a second end portion 607*b* that are located at both ends in a longitudinal direction of the conductor layer 607. The conductor layer 607 includes a first line part 607A including the first end portion 607*a*, a second line part 607B including the second end portion 607*b*, and a center part 607C connecting the first line part 607A and the second line part 607B to each other.

The first line part 607A has a shape elongated in a direction parallel to the X direction. The second line part 607B has a shape elongated in a direction parallel to the Y direction. The first line part 607A is arranged between the conductor layer 606 and the side surface 50F. The second line part 607B is arranged between the first line part 607A and the side surface 50C.

The first line part 607A is connected to the electrode 112 corresponding to the second input/output terminal 3 via the through holes 51T2, 52T2, and 53T2, the conductor layer 562, and the through holes 56T2 and 57T2.

The conductor layer 606 includes a first end portion 606*a* and a second end portion 606*b* that are located at both ends in a longitudinal direction of the conductor layer 606. The conductor layer 606 includes a first line part 606A including the first end portion 606*a*, a second line part 606B including the second end portion 606*b*, and a center part 606C connecting the first line part 606A and the second line part 606B to each other. The second line part 606B has a shape elongated in a direction parallel to the Y direction.

The conductor layer 616 forming the capacitor C6 overlaps with the second line part 606B of the conductor layer 606 and the first line part 607A of the conductor layer 607 as viewed in the stacking direction T. The first line part 606A is arranged between the second line part 606B and the side surface 50C. The second end portion 606*b* is arranged at a position farther from the outer surface (the side surface 50C) of the stack 50 than the first end portion 606*a*.

The conductor layer 603 includes a first end portion 603*a* and a second end portion 603*b* that are located at both ends in a longitudinal direction of the conductor layer 603. The conductor layer 603 includes a first line part 603A including the first end portion 603*a*, a second line part 603B including the second end portion 603*b*, and a center part 603C connecting the first line part 603A and the second line part 603B to each other. The first line part 603A has a shape elongated in a direction parallel to the Y direction. The second line part 603B has a shape elongated in a direction parallel to the X direction.

The conductor layer 612 forming the capacitor C2 overlaps with the center part 602C of the conductor layer 602 and the center part 603C of the conductor layer 603 as viewed in the stacking direction T. The first line part 603A is arranged between the center part 603C and the side surface 50E. The second line part 603B is arranged at such a position as to sandwich the center part 603C with the side surface 50D. The second end portion 603*b* is arranged at a position farther from the outer surface (the side surface 50D) of the stack 50 than the first end portion 603*a*.

The conductor layer 605 includes a first end portion 605*a* and a second end portion 605*b* that are located at both ends in a longitudinal direction of the conductor layer 605. The conductor layer 605 includes a first line part 605A including the first end portion 605*a*, a second line part 605B including the second end portion 605*b*, and a center part 605C connecting the first line part 605A and the second line part 605B to each other. The first line part 605A has a shape elongated in a direction parallel to the Y direction. The second line part 605B has a shape elongated in a direction parallel to the X direction.

The conductor layer 615 forming the capacitor C5 overlaps with the center part 605C of the conductor layer 605 and the center part 606C of the conductor layer 606 as viewed in the stacking direction T. The first line part 605A is arranged between the center part 605C and the side surface 50E. The second line part 605B is arranged at such a position as to sandwich the center part 605C with the side surface 50C. The second end portion 605*b* is arranged at a position farther from the outer surface (the side surface 50C) of the stack 50 than the first end portion 605*a*.

The conductor layer 604 has a shape elongated in a direction parallel to the X direction. The conductor layer 604 includes a first end portion 604*a* and a second end portion 604*b* that are located at both ends in a longitudinal direction of the conductor layer 604. The conductor layer 604 includes a first line part 604A including the first end portion 604*a*, a second line part 604B including the second end portion 604*b*, and a center part 604C connecting the first line part 604A and the second line part 604B to each other.

The first line part 604A of the conductor layer 604 is arranged at such a position as to sandwich the first line part 603A of the conductor layer 603 with the side surface 50D. The conductor layer 613 forming the capacitor C3 overlaps with the first line part 603A of the conductor layer 603 and the first line part 604A of the conductor layer 604 as viewed in the stacking direction T.

The second line part 604B of the conductor layer 604 is arranged at such a position as to sandwich the first line part 605A of the conductor layer 605 with the side surface 50C. The conductor layer 614 forming the capacitor C4 overlaps with the second line part 604B of the conductor layer 604 and the first line part 605A of the conductor layer 605 as viewed in the stacking direction T.

Herein, two three-dimensional regions defined by the resonators 11 to 17 in the stack 50 are described. The stack 50 includes a first region R1 that includes the resonators 11 and 17 and does not include the resonators 13 to 15 and a second region R2 that includes the resonators 13 to 15 and does not include the resonators 11 and 17. In FIG. 13, the rectangular region surrounded by the two-dot chain line denoted with the reference symbol R1 represents the first region R1, and the rectangular region surrounded by the two-dot chain line denoted with the reference symbol R2 represents the second region R2.

The lower end (the end portion in the −Z direction) of each of the first and second regions R1 and R2 is the bottom surface 50A, and the upper end (the end portion in the Z direction) of each of the first and second regions R1 and R2 is the top surface 50B. The end portion of each of the first and second regions R1 and R2 in the −X direction is the side surface 50C, the end portion of each of the first and second regions R1 and R2 in the X direction is the side surface 50D, the end portion of the second region R2 in the −Y direction is the side surface 50E and the end portion of the first region R1 in the Y direction is the side surface 50C. The end portion of the first region R1 in the −Y direction and the end portion of the second region R2 in the Y direction is the XZ plane located between the side surface 50E and the side surface 50F. Note that, in FIG. 13, for the sake of convenience, the plurality of end portions of each of the first and second regions R1 and R2 are shown away from the side surfaces 50C to 50F.

As illustrated in FIG. 13, the conductor layers 601 and 607 as a whole forming the resonators 11 and 17 are included in the first region R1. The conductor layers 603 to 605 as a whole forming the resonators 13 to 15 are included in the second region R2. A part of each of the conductor layers 602 and 606 forming the resonators 12 and 16 is included in the first region R1. The other part of each of the conductor layer 602 and 606 is included in the second region R2.

Next, with reference to FIG. 3 to FIG. 13, the features relating to the conductor layers 521 and 691 and the through holes 52T4, 53T4, 56T4, 57T4, 60T4, 61T4, and 62T4 are described. The filter 1 includes a shield 20 that is formed of a conductor and is integrated with the stack 50. The shield 20 has a function of preventing emission of an electromagnetic wave from the resonators 11 to 17 to the periphery of the stack 50.

The shield 20 includes the conductor layers 521 and 691 and the through holes 52T4, 53T4, 56T4, 57T4, 60T4, 61T4, and 62T4. The conductor layers 521 and 691 are arranged at an interval in the stacking direction T so as to sandwich the resonator conductor layers 601 to 607 forming the resonators 11 to 17. The conductor layer 521 is connected to the plurality of electrodes 113 via the plurality of through holes formed in the dielectric layer 51.

Here, a columnar structure formed by connecting a plurality of through holes in series is referred to as a columnar conductor. The columnar conductor extends in the stacking direction T. The shield 20 includes a plurality of columnar conductors T4 formed by connecting the through holes 52T4, 53T4, 56T4, 57T4, 60T4, 61T4, and 62T4 in series. The plurality of columnar conductors T4 connect the conductor layer 521 and the conductor layer 691 to each other.

The plurality of columnar conductors T4 are arranged along the outer surface of the stack 50 to surround the plurality of resonators. In the exemplary embodiment, in particular, the plurality of columnar conductors T4 are arranged in the second region R2. The plurality of columnar conductors T4 are arranged along the side surfaces 50C, 50D, and 50E of the stack 50 to surround the conductor layers 603 to 605 forming the resonators 13 to 15 and a part of each of the conductor layers 602 and 606 forming the resonators 12 and 16.

The plurality of columnar conductors T4 include two specific first columnar conductors that are arranged at a first interval and two specific second columnar conductors that are arranged at a second interval larger than the first interval. In FIG. 12, the reference symbol T4*a* represents a columnar conductor corresponding to a specific first columnar conductor. The reference symbol T4*b* represents a columnar conductor corresponding to a specific second columnar conductor. The reference symbol T4*c* represents a columnar conductor that functions as the specific first columnar conductor and the specific second columnar conductor. In FIG. 13, the circle drawn with the bold line represents the plurality of columnar conductors T4*c*.

In the example shown in FIG. 12 and FIG. 13, the plurality of columnar conductors T4 include the two specific first columnar conductors T4*a* or T4*c* that are arrayed in a direction parallel to the Y direction. The plurality of columnar conductors T4 include the two specific second columnar conductors T4*b* that are arrayed in a direction parallel to the X direction and the two specific second columnar conductors T4*b* or T4*c* that are arrayed in a direction parallel to the Y direction. The interval between the two specific second columnar conductors T4*b* that are arrayed in a direction parallel to the X direction and the interval between the two specific second columnar conductors T4*b* or T4*c* that are arrayed in a direction parallel to the Y direction may be the same or different from each other. FIG. 12 and FIG. 13 show an example in which the interval between the two specific second columnar conductors T4*b* that are arrayed in a direction parallel to the X direction is larger than the interval between the two specific second columnar conductors T4*b* or T4*c* that are arrayed in a direction parallel to the Y direction.

The stack 50 includes a first dielectric part that is located between the conductor layer 521 and the conductor layer 691 and between the two specific first columnar conductors T4*a* or T4*c* and a second dielectric part that is locater between the conductor layer 521 and the conductor layer 691 and between the two specific second columnar conductors T4*b* or T4*c*. In FIG. 13, the reference symbol 31 represents the first dielectric part, and the reference symbol 32 represents the second dielectric part. Each of the first and second dielectric parts 31 and 32 is formed oaf a part of the dielectric formed by stacking the dielectric layers 52 to 69. Each of the first and second dielectric parts 31 and 32 does not include any conductor.

In the example shown in FIG. 12 and FIG. 13, the stack 50 includes the second dielectric part 32 having a shape elongated in the X direction as viewed in the stacking direction T and the second dielectric part 32 having a shape elongated in the Y direction as viewed in the stacking direction T. The dimension of the second dielectric part 32, which has a shape elongated in the X direction, in a direction parallel to the X direction and the dimension of the second dielectric part 32, which has a shape elongated in the Y direction, in a direction parallel to the Y direction may be the same or different from each other. FIG. 12 and FIG. 13 show an example in which the dimension of the second dielectric part 32, which has a shape elongated in the X direction, in a direction parallel to the X direction is larger than the dimension of the second dielectric part 32, which has a shape elongated in the Y direction, in a direction parallel to the Y direction.

The resonator conductor layer forming each of the resonators 12 to 16 is arranged with reference to the first and second dielectric parts 31 and 32. As the first and second dielectric parts 31 and 32 functioning as a reference for each of the conductor layers, the first and second dielectric parts 31 and 32 that are closest to the conductor layer are selected from the plurality of first dielectric parts 31 and the plurality of second dielectric parts 32 shown in FIG. 13.

At least one of the first line part and the second line part of the conductor layer is arranged at a position closer to the second dielectric part 32 than the first dielectric part 31. In other words, the distance from at least one of the first line part and the second line part of the conductor layer to the second dielectric part 32 is less than the distance from at least one of the first line part and the second line part of the conductor layer to the first dielectric part 31. Note that the positional relationship between the line part and the dielectric part may be defined based on the gravity center of the line part as viewed in the stacking direction T and the gravity center of the dielectric part as viewed in the stacking direction T.

Arrangement of the resonator conductor layers 602 to 606 forming the resonators 12 to 16 is described below. The first line part 602A of the conductor layer 602 is arranged at a position closer to the second dielectric part 32 than the first dielectric part 31. The first line part 606A of the conductor layer 606 is arranged at a position closer to the second dielectric part 32 than the first dielectric part 31.

The first line part 603A of the conductor layer 603 is arranged at a position closer to the second dielectric part 32 than the first dielectric part 31. The center part 603C of the conductor layer 603 is arranged at a position closer to the specific first columnar conductor T4*a* or T4*c* than the second dielectric part 32.

The first line part 605A of the conductor layer 605 is arranged at a position closer to the second dielectric part 32 than the first dielectric part 31. The center part 605C of the conductor layer 605 is arranged at a position closer to the specific first columnar conductor T4*a* or T4*c* than the second dielectric part 32.

Both the first line part 604A and the second line part 604B of the conductor layer 604 are arranged at positions closer to the second dielectric part 32 than the first dielectric part 31. Note that at least one of the second dielectric part 32 closest to the first line part 604A and the second dielectric part 32 closest to the second line part 604B corresponds to a "second dielectric part" in the disclosure, and the other corresponds to a "third dielectric part" in the disclosure. The gravity center of the center part 604C of the conductor layer 604 as viewed in the stacking direction T is arranged at a position closer to the specific second columnar conductor T4*b* than the second dielectric part 32.

Figure 14:
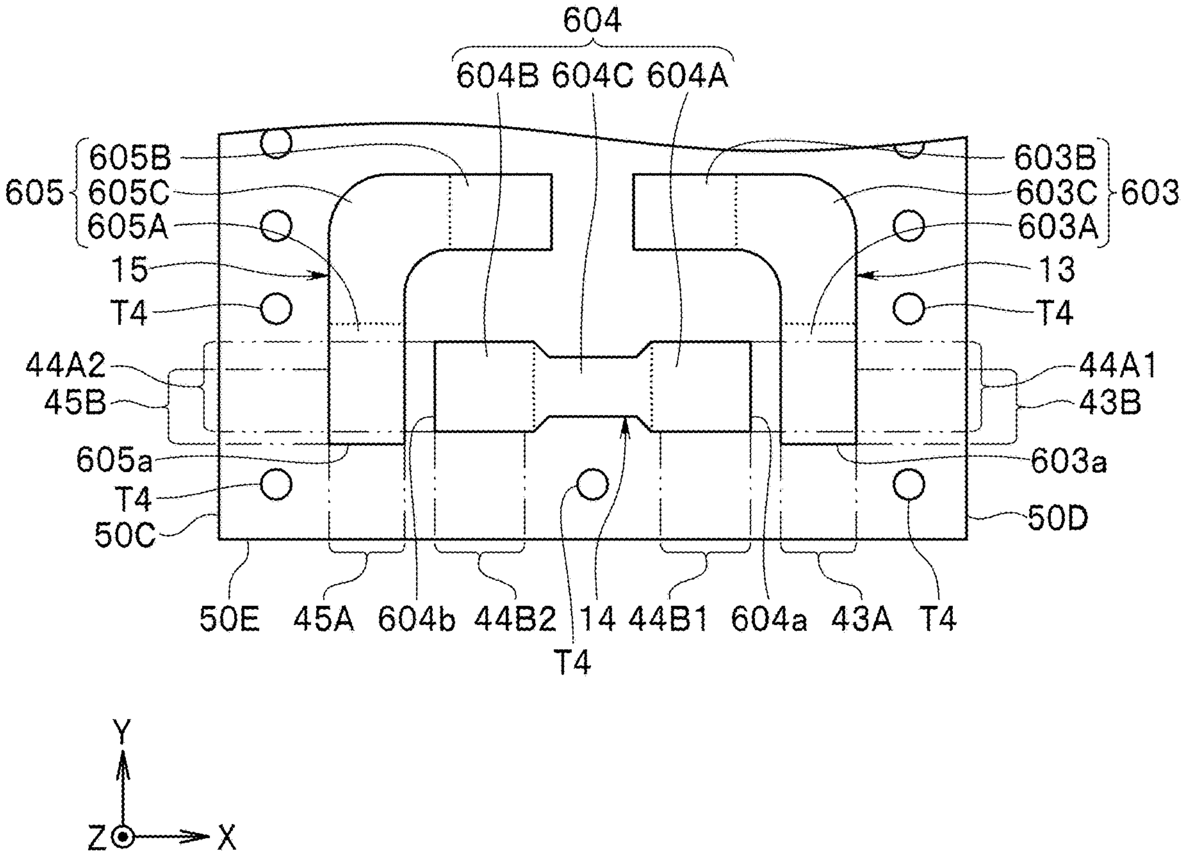
FIG. 14 is a plan view showing a part of the internal structure of the stack of the filter according to the exemplary embodiment of the disclosure in an enlarged manner.

Next, with reference to FIG. 14, arrangement of the conductor layers 603 to 605 and the plurality of columnar conductors T4 is further described in detail. FIG. 14 is a plan view showing a part of the internal structure of the stack 50 in an enlarged manner. The stack 50 includes a front region 43A and an orthogonal region 43B that are defined by the conductor layer 603, front regions 44A1 and 44A2 and orthogonal regions 44B1 and 44B2 that are defined by the conductor layer 604, and a front region 45A and an orthogonal region 45B that are defined by the conductor layer 605.

The front region 43A is a plane region that is located ahead with respect to the first end portion 603*a* of the conductor layer 603 in a first direction (the −Y direction) extending from the boundary between the first line part 603A and the center part 603C toward the outer surface (the side surface 50E) of the stack 50 via the first end portion 603*a* and has the same width as the first line part 603A. The orthogonal region 43B is a plane region that is located ahead with respect to the first line part 603A in a second direction (the X direction) being orthogonal to the first direction and extending toward the outer surface of the stack 50 (the side surface 50D) and has the same width as the first line part 603A.

The front region 44A1 is a plane region that is located ahead with respect to the first end portion 604*a* of the conductor layer 604 in a first direction (the X direction) extending from the boundary between the first line part 604A and the center part 604C toward the outer surface (the side surface 50D) of the stack 50 via the first end portion 604*a* and has the same width as the first line part 604A. The orthogonal region 44B1 is a plane region that is located ahead with respect to the first line part 604A in a second direction (the −Y direction) being orthogonal to the first direction and extending toward the outer surface (the side surface 50E) of the stack 50 and has the same width as the first line part 604A.

The front region 44A2 is a plane region that is located ahead with respect the second end portion 604*b* of to the conductor layer 604 in a third direction (the −X direction) extending from the boundary between the second line part 604B and the center part 604C toward the outer surface (the side surface 50C) of the stack 50 via the second end portion 604*b* and has the same width as the second line part 604B. The orthogonal region 44B2 is a plane region that is located ahead with respect to the second line part 604B in a fourth direction (the −Y direction) being orthogonal to the third direction and extending toward the outer surface (the side surface 50E) of the stack 50 and has the same width as the second line part 604B.

The front region 45A is a plane region that is located ahead with respect to the first end portion 605*a* of the conductor layer 605 in a first direction (the −Y direction) extending from the boundary between the first line part 605A and the center part 605C toward the outer surface (the side surface 50E) of the stack 50 via the first end portion 605*a* and has the same width as the first line part 605A. The orthogonal region 45B is a plane region that is located ahead with respect to the first line part 605A in a second direction (the −X direction) being orthogonal to the first direction and extending toward the outer surface (the side surface 50C) of the stack 50 and has the same width as the first line part 605A.

As shown in FIG. 14, in the front regions 43A, 44A1, 44A2, and 45A and the orthogonal regions 43B, 44B1, 44B2, and 45B, the plurality of columnar conductors T4 are not provided.

Next, with reference to FIG. 3 to FIG. 13, the features relating to the through holes 52T3, 53T3, 56T3, 57T3, 60T3, 61T3, and 62T3 are described. The shield 20 further includes a plurality of columnar conductors T3 formed by connecting the through holes 52T3, 53T3, 56T3, 57T3, 60T3, 61T3, and 62T3 in series. The plurality of columnar conductors T3 connect the conductor layer 521 and the conductor layer 691 to each other.

The plurality of columnar conductors T3 are arranged in the first region R1, and are arranged along the side surface 50F of the stack 50. The plurality of columnar conductors T3 and the plurality of columnar conductors T4 are arranged to surround the conductor layers 601 to 607 forming the plurality of resonators 11 to 17.

In addition to the function of preventing emission of an electro-magnetic wave from the resonators 11 to 17 to the periphery of the stack 50, the plurality of columnar conductors T3 have a function of suppressing coupling between the first input/output terminal 2 and the second input/output terminal 3. The interval between the two freely-selected adjacent columnar conductors T3 among the plurality of columnar conductors T3 may be the same as the first interval, may be less than the first interval, or may be more than the first interval.

Next, with reference to FIG. 3 to FIG. 13, the features relating to the through holes 52T5, 53T5, 56T5, 57T5, 60T5, 61T5, and 62T5 are described. A plurality of columnar conductors T5 are formed by connecting the through holes 52T5, 53T5, 56T5, 57T5, 60T5, 61T5, and 62T5 are connected in series. The plurality of columnar conductors T5 connect the conductor layer 521 and the conductor layer 608 to each other, and connect the conductor layer 608 and the conductor layer 691 to each other.

The plurality of columnar conductors T5 extend so that at least a part thereof passes through between the conductor layer 602 and the conductor layer 606. The plurality of columnar conductors T5 have a function of adjusting coupling between the resonator 12 and the resonator 16. The plurality of columnar conductors T5 may function so as to adjust coupling between the resonator 12 and the resonator 16. The interval between the two freely-selected adjacent columnar conductors T5 among the plurality of columnar conductors T5 may be the same as the first interval, may be less than the first interval, or may be more than the first interval.

Next, a method of manufacturing the stack 50 is briefly described. For example, the stack 50 is fabricated by a low-temperature co-firing method, using ceramic as the material of the dielectric layers 51 to 69. In this case, a plurality of ceramic green sheets, which eventually become the dielectric layers 51 to 69, are fabricated first. Each of the ceramic green sheets includes a plurality of unfired conductor layers formed thereon and a plurality of unfired through holes formed therein. The plurality of unfired conductor layers eventually become a plurality of conductor layers or a plurality of electrodes. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete the stack 50.

Next, the actions and effects of the filter 1 according to the exemplary embodiment are described. In the exemplary embodiment, the plurality of columnar conductors T4 are arranged to surround the plurality of resonators. When the interval between the resonator and the plurality of columnar conductors T4 is changed due to misalignment in the stack 50 during manufacturing, characteristics of the resonator are also changed. In particular, when the resonator is an open-ended resonator, the resonator and the plurality of columnar conductors T4 are capacitively coupled. The capacitive coupling achieves a wavelength shortening effect. When misalignment occurs in the positional relationship between the resonator and the plurality of columnar conductors T4 due to manufacturing variations, characteristics of the resonator, such as a resonance frequency, are changed, and a problem that desired filter characteristics cannot be obtained arises.

In contrast, in the exemplary embodiment, each of the first line part 602A of the conductor layer 602, the first line part 603A of the conductor layer 603, the first line part 604A and the second line part 604B of the conductor layer 604, the first line part 605A of the conductor layer 605, and the first line part 605A of the conductor layer 606 is arranged at a position closer to the second dielectric part 32 corresponding to the line part than the first dielectric part 31 corresponding to the line part. The interval between the two specific second columnar conductors T4*b* or T4*c*, which defines the size of the second dielectric part 32, is larger than the interval between the two specific first columnar conductors T4*a* or T4*c*, which defines the size of the first dielectric part 31. Each of the first and second dielectric parts 31 and 32 does not include any conductor. Thus, in the periphery of the first line parts 603A, 604A, and 605A and the second line part 604B, the density of the conductor is relatively small. With this, according to the exemplary embodiment, coupling between the one end portion of the resonator and the conductor can be suppressed, and changes in filter characteristics due to misalignment in the stack 50 during manufacturing can be suppressed.

In the exemplary embodiment, as described above, in the front regions 43A, 44A1, 44A2, and 45A and the orthogonal regions 43B, 44B1, 44B2, and 45B, the plurality of columnar conductors T4 are not provided. With this, according to the exemplary embodiment, changes in filter characteristics due to misalignment in the stack 50 during manufacturing can be suppressed more effectively.

Next, with reference to a simulation result, effects of the exemplary embodiment are described. First, models in first to third examples and models in first to third comparative examples that are used in the simulation are described. The model in the first example is a model of the filter 1 according to the exemplary embodiment. The model in the first comparative example is a model of a filter 101 in the comparative example.

Figure 15:
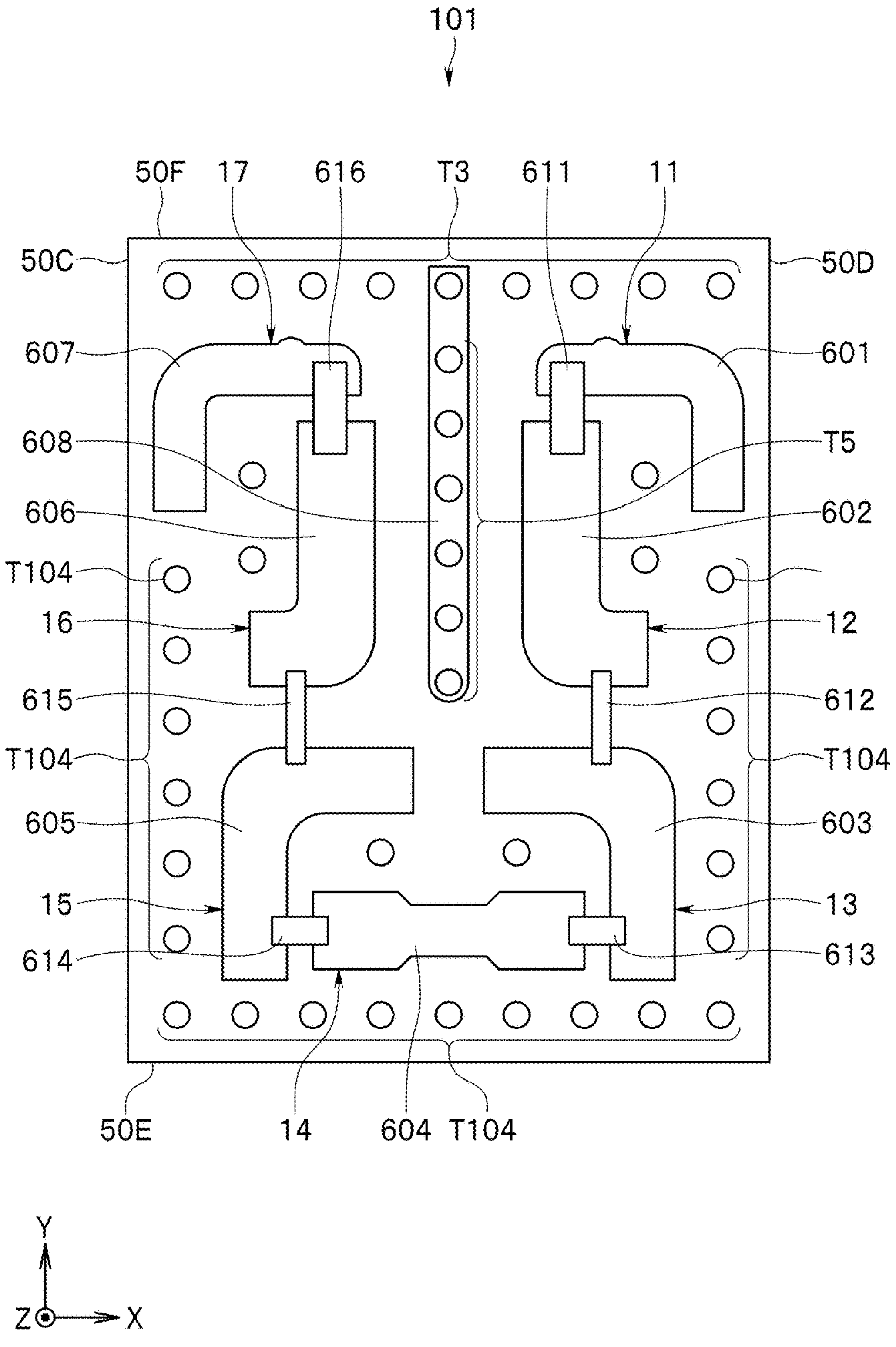
FIG. 15 RELATED ART
FIG. 15 is a plan view showing a part of an internal structure of a stack of a filter in a comparative example.

FIG. 15 is a plan view showing a part of an internal structure of the filter 101 in the comparative example. The filter 101 in the comparative example includes a plurality of columnar conductors T104 in place of the plurality of columnar conductors T4 in the exemplary embodiment. The shape and arrangement of the plurality of columnar conductors T104 are basically the same as the shape and arrangement of the plurality of columnar conductors T4. However, in the plurality of columnar conductors T104, an interval between any two adjacent columnar conductors is uniform.

In the model in the second example and the model in the second comparative example, the dielectric layer 60 in which the resonator conductor layers 601 to 607 are formed and the dielectric layer 61 in which the conductor layers 611 to 616 forming the capacitors C1 to C6 are formed are deviated by 25 μm in the Y direction with respect to the other dielectric layers 51 to 59 and 62 to 69.

In the model in the third example and the model in the third comparative example, the dielectric layers 60 and 61 are deviated by 25 μm in the −Y direction with respect to the other dielectric layers 51 to 59 and 62 to 69.

In the simulation, for each of the models in the first to third examples and the models in the first to third comparative examples, pass attenuation characteristics are obtained, and a value of a frequency at which an attenuation is −10 dB on the high-frequency side of the passband is obtained.

Next, the simulation result is described. The value of the specific frequency of the model in the first example is 41,205 MHZ, the value of the specific frequency of the model in the second example is 41,180 MHZ, and the value of the specific frequency of the model in the third example is 41,226 MHz. The amount of change of the value of the specific frequency between the models in the first to third examples is 46 MHz.

The value of the specific frequency of the model in the first comparative example is 41,210 MHz, the value of the specific frequency of the model in the second comparative example is 41,322 MHz, and the value of the specific frequency of the model in the third comparative example is 40,982 MHZ. The amount of change of the value of the specific frequency between the models in the first to third comparative examples is 340 MHz.

As understood from the result of the simulation, according to the exemplary embodiment, changes in pass attenuation characteristics due to misalignment in the stack 50 during manufacturing can be suppressed by increasing the interval between some columnar conductors among the plurality of columnar conductors T4.

Next, other effects of the exemplary embodiment are described. In the exemplary embodiment, emission of an electro-magnetic wave from the resonator 13 is more significant in the center part 603C of the conductor layer 603 than the first and second line parts 603A and 603B of the conductor layer 603. In contrast, in the exemplary embodiment, the center part 603C is arranged at a position closer to the specific first columnar conductor T4*a* or T4*c* than the second dielectric part 32. With this, according to the exemplary embodiment, radiation of an electro-magnetic wave from the resonator 13 can be suppressed as compared to a case in which the columnar conductor T4 is not provided in the vicinity of the center part 603C.

The description regarding the resonator 13 above is applicable to the resonators 14 and 15.

Note that the disclosure is not limited to the exemplary embodiment described above, and various modifications may be made thereto. For example, the number of resonators and the configuration thereof are not limited to those described in the exemplary embodiment as long as the scope of the claims are satisfied. The number of resonators is not limited to seven, and may be five, six, eight, or more.

As described above, a filter according to one embodiment of the disclosure includes a stack including a plurality of dielectric layers being stacked together, a first input/output terminal and a second input/output terminal that are integrated with the stack, a plurality of resonators being provided in the stack and being provided between the first input/output terminal and the second input/output terminal in a circuit configuration, and a shield being formed of a conductor and being integrated with the stack. The plurality of resonators includes a first resonator, a second resonator, and a third resonator provided between the first resonator and the second resonator in the circuit configuration. The first resonator is connected to the first input/output terminal. The second resonator is connected to the second input/output terminal.

The third resonator includes a first resonator conductor layer extending along an orthogonal plane orthogonal to a stacking direction of the plurality of dielectric layers. The first resonator conductor layer includes a first end portion and a second end portion that are located at both ends in a longitudinal direction of the first resonator conductor layer, and includes a first line part including the first end portion, a second line part including the second end portion, and a first center part connecting the first line part and the second line part to each other. The shield includes a first conductor layer and a second conductor layer that are arranged at an interval in the stacking direction so as to sandwich the plurality of resonators, and a plurality of columnar conductors that respectively extend in the stacking direction and connect the first conductor layer and the second conductor layer to each other. The plurality of columnar conductors are arrayed along an outer surface of the stack so as to surround the plurality of resonators. The plurality of columnar conductors include two specific first columnar conductors that are arranged at a first interval and two specific second columnar conductors that are arranged at a second interval larger than the first interval.

The stack further includes a first dielectric part located between the first conductor layer and the second conductor layer and between the two specific first columnar conductors, and a second dielectric part located between the first conductor layer and the second conductor layer and between the two specific second columnar conductors. At least one of the first line part and the second line part is arranged at a position closer to the second dielectric part than the first dielectric part.

In the filter according to one embodiment of the disclosure, the stack may include a first region that includes the first resonator and the second resonator and does not include the third resonator and a second region that includes the third resonator and does not include the first resonator and the second resonator. The plurality of columnar conductors may be arranged in the second region.

In the filter according to one embodiment of the disclosure, the first center part may be arranged at a position closer to the two specific first columnar conductors than the second dielectric part. Alternatively, the first center part may be arranged at a position closer to one of the two specific second columnar conductors than the second dielectric part.

In the filter according to one embodiment of the disclosure, the plurality of columnar conductors may further include two specific third columnar conductors arranged at a third interval larger than the first interval. The stack further may include a third dielectric part located between the first conductor layer and the second conductor layer and between the two specific third columnar conductors. The first line part may be arranged at a position closer to the second dielectric part than the first dielectric part. The second line part may be arranged at a position closer to the third dielectric part than the first dielectric part.

In the filter according to one embodiment of the disclosure, the first line part may be arranged at a position closer to the second dielectric part than the first dielectric part. The second end portion of the first resonator conductor layer may be arranged at a position farther from the outer surface of the stack than the first end portion of the first resonator conductor layer.

In the filter according to one embodiment of the disclosure, the stack may include a first front region that is located ahead with respect to the first end portion of the first resonator conductor layer in a first direction extending from a boundary between the first line part and the first center part toward the outer surface of the stack via the first end portion and has the same width as the first line part, and a first orthogonal region that is located ahead with respect to the first line part in a second direction being orthogonal to the first direction and extending toward the outer surface of the stack and has the same width as the first line part. The first front region and the first orthogonal region may not be provided with the plurality of columnar conductors. The stack may further include a second front region that is located ahead with respect to the second end portion of the first resonator conductor layer in a third direction extending from a boundary between the second line part and the first center part toward the outer surface of the stack via the second end portion and has the same width as the second line part, and a second orthogonal region that is located ahead with respect to the second line part in a fourth direction being orthogonal to the third direction and extending toward the outer surface of the stack and has the same width as the second line part. The second front region and the second orthogonal region may not be provided with the plurality of columnar conductors.

In the filter according to one embodiment of the disclosure, the first line part of the third resonator may be arranged at a position closer to the second dielectric part than the first dielectric part. The plurality of resonators may further include a fourth resonator. The fourth resonator may include a second resonator conductor layer extending along the orthogonal plane. The second resonator conductor layer may include a third end portion and a fourth end portion that are located at both ends in a longitudinal direction of the second resonator conductor layer, and may include a third line part including the third end portion, a fourth line part including the fourth end portion, and a second center part connecting the third line part and the fourth line part to each other. The third line part of the fourth resonator may be arranged in the vicinity of the first line part of the third resonator. The plurality of columnar conductors may further include two specific third columnar conductors arranged at a third interval larger than the first interval. The stack further may include a third dielectric part located between the first conductor layer and the second conductor layer and between the two specific third columnar conductors. The plurality of resonators may further include a fifth resonator. The fifth resonator may include a third resonator conductor layer extending along the orthogonal plane. The third resonator conductor layer may include a fifth end portion and a sixth end portion that are located at both ends in a longitudinal direction of the third resonator conductor layer, and may include a fifth line part including the fifth end portion, a sixth line part including the sixth end portion, and a third center part connecting the fifth line part and the sixth line part to each other. The fifth line part of the fifth resonator may be arranged at a position closer to the third dielectric part than the first dielectric part. The fourth line part of the fourth resonator may be arranged in the vicinity of the fifth line part of the fifth resonator.

In the filter according to one embodiment of the disclosure, the fourth resonator may be provided at a position farther from both the first input/output terminal and the second input/output terminal than a resonator other than the fourth resonator among the plurality of resonators.

In the filter according to one embodiment of the disclosure, the number of the plurality of resonators may be an odd number. The plurality of resonators may not include another resonator symmetric to the fourth resonator.

In the filter of the disclosure, at least one of the first line part and the second line part is arranged at the position closer to the second dielectric part than the first dielectric part. With this, according to the disclosure, changes in characteristics due to misalignment in the stack during manufacturing can be suppressed.

It is apparent that the disclosure can be carried out in various forms and modifications in the light of the foregoing descriptions. Accordingly, within the scope of the following claims and equivalents thereof, the disclosure can be carried out in forms other than the foregoing example embodiments.

The invention claimed is:

1. A filter comprising:

a stack including a plurality of dielectric layers being stacked together;

a first input/output terminal and a second input/output terminal that are integrated with the stack;

a plurality of resonators being provided in the stack and being provided between the first input/output terminal and the second input/output terminal in a circuit configuration; and a shield being formed of a conductor and being integrated with the stack, wherein the plurality of resonators includes a first resonator, a second resonator, and a third resonator provided between the first resonator and the second resonator in the circuit configuration, the first resonator is connected to the first input/output terminal, the second resonator is connected to the second input/output terminal, the third resonator includes a first resonator conductor layer extending along an orthogonal plane orthogonal to a stacking direction of the plurality of dielectric layers, the first resonator conductor layer includes a first end portion and a second end portion that are located at both ends in a longitudinal direction of the first resonator conductor layer, and includes a first line part including the first end portion, a second line part including the second end portion, and a first center part connecting the first line part and the second line part to each other, the shield includes a first conductor layer and a second conductor layer that are arranged at an interval in the stacking direction to sandwich the plurality of resonators, and a plurality of columnar conductors that extend in the stacking direction and connect the first conductor layer and the second conductor layer to each other, the plurality of columnar conductors are arrayed along an outer surface of the stack to surround the plurality of resonators, the plurality of columnar conductors include two specific first columnar conductors that are arranged at a first interval and two specific second columnar conductors that are arranged at a second interval larger than the first interval, the stack further includes a first dielectric part located between the first conductor layer and the second conductor layer and between the two specific first columnar conductors, and a second dielectric part located between the first conductor layer and the second conductor layer and between the two specific second columnar conductors, and at least one of the first line part and the second line part is arranged at a position closer to the second dielectric part than the first dielectric part.

2. The filter according to claim 1, wherein the stack includes a first region that includes the first resonator and the second resonator and does not include the third resonator and a second region that includes the third resonator and does not include the first resonator and the second resonator, and the plurality of columnar conductors are arranged in the second region.

3. The filter according to claim 1, wherein the first center part is arranged at a position closer to the two specific first columnar conductors than the second dielectric part.

4. The filter according to claim 1, wherein the first center part is arranged at a position closer to one of the two specific second columnar conductors than the second dielectric part.

5. The filter according to claim 1, wherein the plurality of columnar conductors further includes two specific third columnar conductors arranged at a third interval larger than the first interval, the stack further includes a third dielectric part located between the first conductor layer and the second conductor layer and between the two specific third columnar conductors, the first line part is arranged at a position closer to the second dielectric part than the first dielectric part, and the second line part is arranged at a position closer to the third dielectric part than the first dielectric part.

6. The filter according to claim 1, wherein the first line part is arranged at a position closer to the second dielectric part than the first dielectric part, and the second end portion of the first resonator conductor layer is arranged at a position farther from the outer surface of the stack than the first end portion of the first resonator conductor layer.

7. The filter according to claim 1, wherein the stack includes:

a first front region that is located ahead with respect to the first end portion of the first resonator conductor layer in a first direction extending from a boundary between the first line part and the first center part toward the outer surface of the stack via the first end portion and has the same width as the first line part; and a first orthogonal region that is located ahead with respect to the first line part in a second direction being orthogonal to the first direction and extending toward the outer surface of the stack and has the same width as the first line part, and the first front region and the first orthogonal region are not provided with the plurality of columnar conductors.

8. The filter according to claim 7, wherein the stack further includes:

a second front region that is located ahead with respect to the second end portion of the first resonator conductor layer in a third direction extending from a boundary between the second line part and the first center part toward the outer surface of the stack via the second end portion and has the same width as the second line part; and a second orthogonal region that is located ahead with respect to the second line part in a fourth direction being orthogonal to the third direction and extending toward the outer surface of the stack and has the same width as the second line part, and the second front region and the second orthogonal region are not provided with the plurality of columnar conductors.

9. The filter according to claim 1, wherein the first line part of the third resonator is arranged at a position closer to the second dielectric part than the first dielectric part, the plurality of resonators further includes a fourth resonator, the fourth resonator includes a second resonator conductor layer extending along the orthogonal plane, the second resonator conductor layer includes a third end portion and a fourth end portion that are located at both ends in a longitudinal direction of the second resonator conductor layer, and includes a third line part including the third end portion, a fourth line part including the fourth end portion, and a second center part connecting the third line part and the fourth line part to each other, and the third line part of the fourth resonator is arranged in the vicinity of the first line part of the third resonator.

10. The filter according to claim 9, wherein the plurality of columnar conductors further include two specific third columnar conductors arranged at a third interval larger than the first interval, the stack further includes a third dielectric part located between the first conductor layer and the second conductor layer and between the two specific third columnar conductors, the plurality of resonators further include a fifth resonator, the fifth resonator includes a third resonator conductor layer extending along the orthogonal plane, the third resonator conductor layer includes a fifth end portion and a sixth end portion that are located at both ends in a longitudinal direction of the third resonator conductor layer, and includes a fifth line part including the fifth end portion, a sixth line part including the sixth end portion, and a third center part connecting the fifth line part and the sixth line part to each other, the fifth line part of the fifth resonator is arranged at a position closer to the third dielectric part than the first dielectric part, and the fourth line part of the fourth resonator is arranged in the vicinity of the fifth line part of the fifth resonator.

11. The filter according to claim 10, wherein the fourth resonator is provided at a position farther from both the first input/output terminal and the second input/output terminal than a resonator other than the fourth resonator among the plurality of resonators.

12. The filter according to claim 10, wherein the number of the plurality of resonators is an odd number, and the plurality of resonators does not include another resonator symmetric to the fourth resonator.

* * * * *